United States Patent
Daneman et al.

(10) Patent No.: US 8,384,134 B2
(45) Date of Patent: Feb. 26, 2013

(54) MEMS DEVICE INCLUDING AN ELECTRICAL INTERCONNECT THROUGH A SUBSTRATE

(75) Inventors: Michael J. Daneman, Campbell, CA (US); Steven S. Nasiri, Saratoga, CA (US); Martin Lim, San Mateo, CA (US)

(73) Assignee: Invensense, Inc., Sunnyvale, CA (US)

( * ) Notice: Subject to any disclaimer, the term of this patent is extended or adjusted under 35 U.S.C. 154(b) by 0 days.

(21) Appl. No.: 13/455,494

(22) Filed: Apr. 25, 2012

(65) Prior Publication Data

US 2012/0235297 A1 Sep. 20, 2012

Related U.S. Application Data

(63) Continuation of application No. 13/367,271, filed on Feb. 6, 2012.

(60) Provisional application No. 61/452,545, filed on Mar. 14, 2011.

(51) Int. Cl.
- *H01L 27/148* (2006.01)
- *H01L 29/84* (2006.01)
- *H01L 21/00* (2006.01)

(52) U.S. Cl. .......... 257/226; 257/415; 438/464

(58) Field of Classification Search .......... 257/226, 257/415; 438/464
See application file for complete search history.

(56) References Cited

U.S. PATENT DOCUMENTS

| 5,270,261 A | 12/1993 | Bertin et al. | |
|---|---|---|---|
| 6,544,898 B2 | 4/2003 | Polson et al. | |
| 7,104,129 B2 | 9/2006 | Nasiri et al. | |
| 2006/0208326 A1 | 9/2006 | Nasiri et al. | |
| 2007/0281381 A1* | 12/2007 | Ayazi | 438/52 |
| 2010/0279451 A1 | 11/2010 | Nabki et al. | |
| 2011/0049652 A1 | 3/2011 | Wu et al. | |
| 2011/0147859 A1* | 6/2011 | Tanaka et al. | 257/415 |
| 2011/0155548 A1* | 6/2011 | Foster et al. | 200/181 |
| 2012/0049299 A1* | 3/2012 | Chou | 257/417 |
| 2012/0080761 A1* | 4/2012 | Hsieh et al. | 257/414 |
| 2012/0098122 A1* | 4/2012 | Yang | 257/737 |

FOREIGN PATENT DOCUMENTS

WO   WO 2009/061747   5/2009

OTHER PUBLICATIONS

Cheng, et al., "A MEMS micromirror fabricated using using CMOS post-process," Sensors and Actuators A 120, pp. 573-581, Mar. 17, 2005.
Baltes, et al., "Packaging of CMOS MEMS," Microelectronics Reliability 40 (2000), pp. 1255-1262.

* cited by examiner

*Primary Examiner* — James Mitchell
(74) *Attorney, Agent, or Firm* — Sawyer Law Group, P.C.

(57) ABSTRACT

A MEMS device is disclosed. The MEMS device comprises a MEMS substrate and a CMOS substrate having a front surface, a back surface and one or more metallization layers. The front surface being bonded to the MEMS substrate. The MEMS device includes one or more conductive features on the back surface of the CMOS substrate and electrical connections between the one or more metallization layers and the one or more conductive features.

18 Claims, 3 Drawing Sheets

MEMS DEVICE INCLUDING AN ELECTRICAL INTERCONNECT THROUGH A SUBSTRATE

CROSS-REFERENCE TO RELATED APPLICATION

Under 35 U.S.C. §120 the present application is a continuation of U.S. patent application Ser. No. 13/367,271, filed on Feb. 6, 2012, entitled "WAFER LEVEL PACKAGING OF MEMS DEVICES," which claims priority to U.S. Provisional Application No. 61/452,545, filed on Mar. 14, 2011, entitled "WAFER LEVEL PACKAGING OF MEMS DEVICES REQUIRING TOP-SIDE ELECTRICAL CONTACT," all of which are incorporated herein by reference.

FIELD OF THE INVENTION

The present invention relates generally to semiconductor devices, and more particularly to packaging of MEMS devices.

BACKGROUND OF THE INVENTION

Wafer-level packaging of semiconductor devices is a relatively new but widely used technology that allows semiconductor and MEMS devices to be packaged on a wafer scale with solder balls attached directly to the die (typically through a stress-relief layer). This technology yields the smallest possible package size for any given device while at the same time reducing packaging cost by packaging an entire wafer of die in a batch process. The most common wafer-level packaging technologies (ex. Shellcase, uBGA, WAVE, and others) typically make direct contact to the CMOS wafer metallization, but cannot easily contact the top-layer of the MEMS since it is typically electrically isolated from the CMOS. In cases where the MEMS handle or cap wafer or a metal layer deposited onto the MEMS handle or cap wafer must be electrically contacted, the current wafer-level packaging technologies cannot be directly applied.

Accordingly, what is desired is a system and method which would overcome the above-identified issues. The method and system should be easy to implement, cost-effective, and adaptable to existing systems. The present invention addresses such a need.

SUMMARY OF THE INVENTION

A MEMS device is disclosed. The MEMS device comprises a MEMS substrate and a CMOS substrate having a front surface, a back surface and one or more metallization layers. The front surface being bonded to the MEMS substrate. The MEMS device includes one or more conductive features on the back surface of the CMOS substrate and electrical connections between the one or more metallization layers and the one or more conductive features.

DETAILED DESCRIPTION

The present invention relates generally to semiconductor devices, and more particularly to the packaging of MEMS devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A MEMS device often requires a MEMS handle electrical contact. This contact can either be used for RF shielding of the device or to make electrical contact to a MEMS handle wafer. A method and system in accordance with the present invention enables wafer-level packaging (WLP) also known as wafer-level chip scale packaging (WLCSP), of such MEMS devices using CMOS-side contact based on a Shellcase or Through Silicon Via (TSV) process, or any other wafer-level packaging process providing a CMOS-side electrical contact, while still providing a MEMS handle-side electrical connection.

The structure and process for wafer-level packaging of MEMS devices comprises:

1. A MEMS device wafer comprising a CMOS substrate bonded to a MEMS substrate, the MEMS substrate comprising a handle wafer with cavities bonded to a patterned electrically conductive Device Layer with an insulating layer positioned between the two wafers.

2. A top metallization layer electrically connected to the Device Layer comprising:

(a) A wedge-shaped opening penetrating completely through the Handle Wafer and insulating layers, and partially penetrating into the Device Wafer.

(b) A conducting layer deposited onto the MEMS substrate such that the conducting layer covers the sidewalls of the wedge-shaped opening including making physical contact to a portion of the Device Layer thereby electrically connecting the conductive layer to the portion of the Device layer. Optionally, the conducting layer may also make electrical contact to the Handle Wafer, thereby electrically connecting the Handle Wafer to the portion of the Device Wafer.

3. One or more openings in the back-side of the CMOS substrate exposing one or more metal interconnection layer.

4. An insulating layer coating the sidewalls of the one or more openings and the back-side of the CMOS substrate.

5. A conductive layer coating the insulating layer on the back-side of the CMOS substrate and on sidewalls of the one or more openings and providing physical and electrical contact to the one or more metal interconnection layers.

6. One or more solder-balls connected to the conductive layer.

Figure 1:
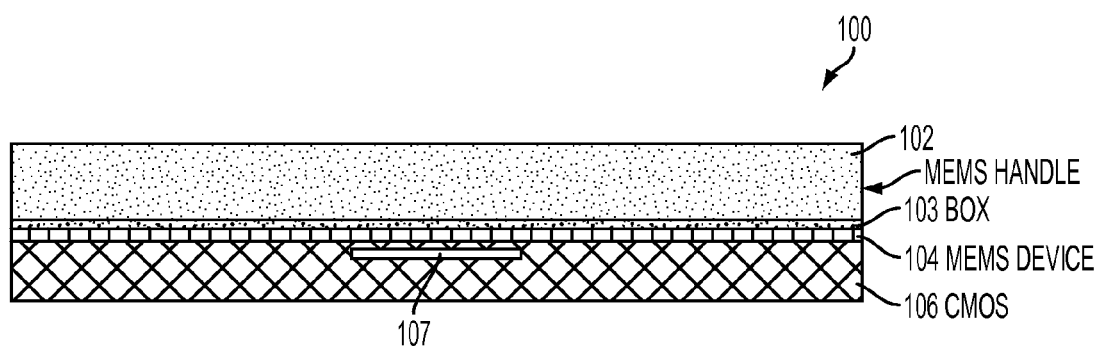
FIG. 1 is a diagram of a semiconductor device in accordance with an embodiment.

In the preferred embodiment a MEMS bonded device wafer would comprise a standard CMOS wafer with an Aluminum or Copper top metallization layer eutecticly bonded to a MEMS wafer. To describe the features of the invention in more detail refer now to the following description in connection with the accompanying Figures. FIG. 1 is a diagram of a semiconductor device 100 in accordance with an embodiment before processing. The semiconductor device 100 comprises a MEMS handle 102; a silicon oxide layer 103, a MEMS device layer 104, and a CMOS wafer 106.

The handle wafer 102 includes etched cavities and is coated by, for example, a thin silicon oxide layer and fusion bonded to a MEMS device layer 104. The MEMS device layer 104 is patterned to define the desired moveable or stationary structure.

Figure 2A:
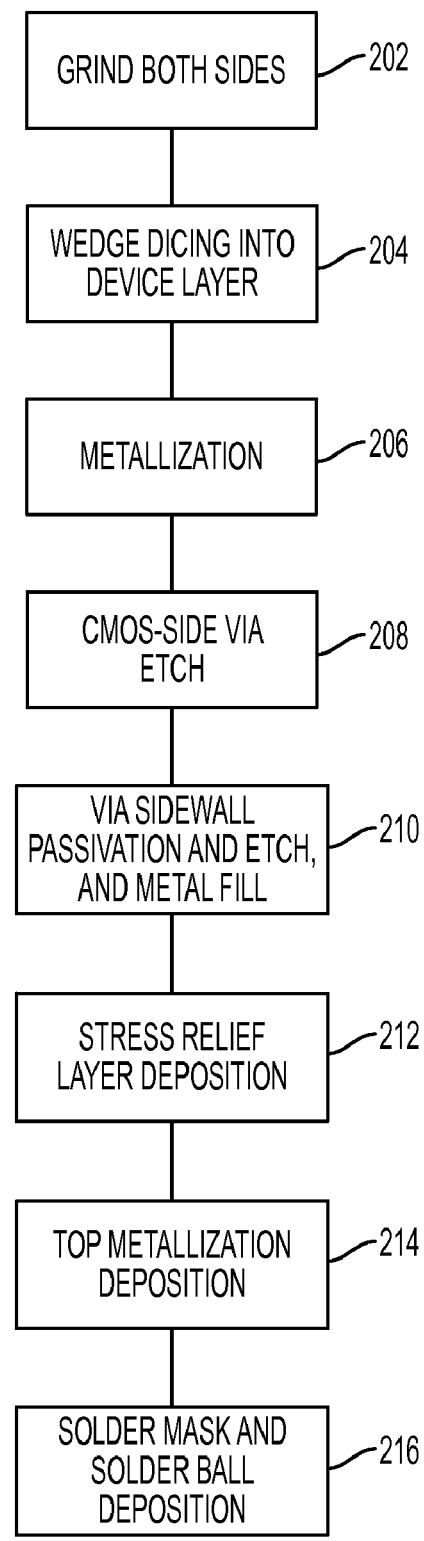
FIG. 2A is a flow chart of a packaging process in accordance with the present invention.
Figure 2B:
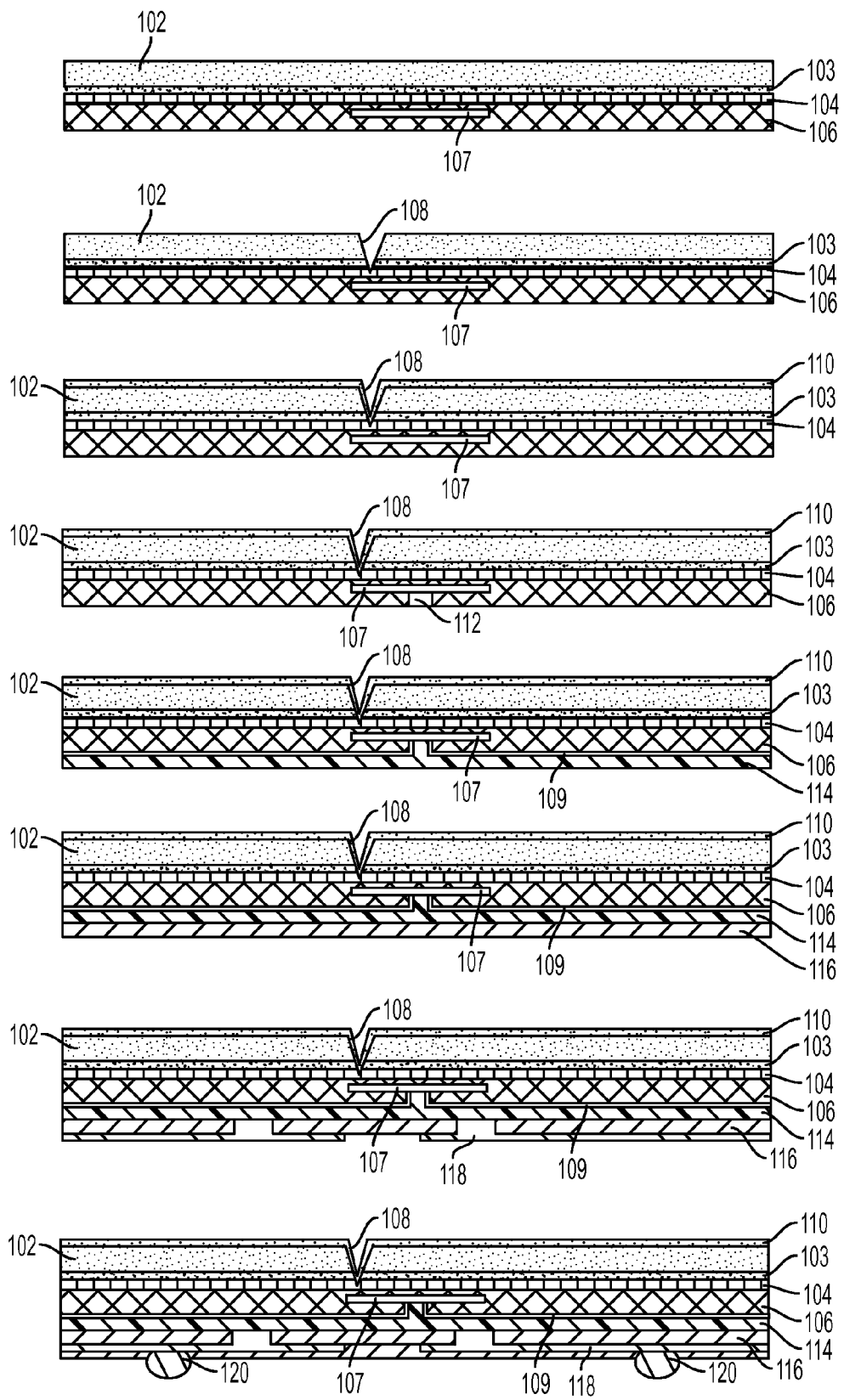
FIG. 2B is a diagram which illustrates building up a wafer level package utilizing the process of FIG. 2A.

FIG. 2A is a flow chart of a packaging process in accordance with the present invention. FIG. 2B is a diagram which illustrates building up a wafer level package utilizing the process of FIG. 2A.

Referring now to FIGS. 2A and 2B together, initially both sides of the device (CMOS side 106 and MEMS handle 102), are ground down to the desired size, using step 202.

Thereafter, wedge shaped cuts are made in the non-functional region of the MEMS so as to cut completely through the handle wafer 102 and silicon oxide layer 103 and cut partially into the device layer 104, using step 204, leaving a wedge-shaped opening 108 in the device 100. In an alternate embodiment, the wedge-shaped opening can be created using a wet or dry etching of the handle wafer 102 and silicon oxide layer 103. The required wedge angle depends on the conformality of the metal deposition system used for the following metal deposition.

Next, a conductive metallization layer 110 is blanket deposited onto the MEMS side of the device 100, using step 206. The metallization (for example, aluminum or copper) layer may be sputter deposited, evaporated, or deposited through plasma or thermally enhanced chemical vapor deposition (CVD).

The metallization layer 110 covers the top surface of the semiconductor device 100 as well as the side-walls of the wedge-shaped openings 108, thereby making a physical and electrical contact to the device layer 104. Due to the high doping of the device layer 104, an ohmic contact will be formed to the metallization layer 110. In some embodiments an additional anneal may be required to enhance diffusion of metallization into silicon to enhance electrical contact. In an alternate embodiment, the metallization layer 110 may comprise any electrically conductive metal or semi-conductor.

Next the device is packaged using a through-silicon-via (TSV) wafer level packaging process.

The TSV process begins with an opening 112 being etched in the back of the CMOS substrate 106 stopping on one of the CMOS metallization layers, using step 208. The CMOS substrate 106 metallization layer 107 may be any one of the existing CMOS metallization layers. The sidewalls of the opening 112 are then electrically passivated by depositing an insulating film 109 (ex. silicon oxide, silicon nitride, polymer), using step 210. Typically the insulating film 109 will also deposit on the bottom surface of the opening 112, covering the previously exposed CMOS metallization layer 107.

The CMOS metallization layer 107 is then once again exposed by an etching or saw dicing process such that the insulating film 109 on the sidewalls of the opening is not removed. This etching or saw dicing process may expose the surface, edges, or both of the CMOS metallization layer 107. A conductive interconnection layer, 114, (typically a metal layer composed of Aluminum or Copper) is deposited onto the back surface of the CMOS substrate 106 and into the passivated openings 112 so as to create electrical contact to the CMOS metallization layer 107.

The interconnection layer 114 is then patterned so as to create individual isolated contacts. A polymer stress-relief layer 116 would optionally be deposited on top of the interconnection layer 114 to reduce stress on the silicon die caused by board-level assembly, using step 212. The stress-relief layer 116 is patterned so as to create vias to the interconnection layer 114. Then a conductive redistribution layer 118 is deposited and patterned on top of the stress-relief layer 116, using step 214. Finally, solder balls 120 are defined on top of the redistribution layer 118 to facilitate soldering the packaged die to a printed circuit board, using step 216.

In a first alternate embodiment, the die may be packaged using Shellcase wedge-dicing type wafer level packaging process.

In a second alternate embodiment, the die may be packaged using any available packaging technology using wire bonding including but not limited to a Leadless Chip Carrier (LCC), a Quad Flat No Leads (QFN) or a Multichip module.

In a third alternate embodiment, the openings in the handle-wafer side of the MEMS may be etched rather than saw-diced. Furthermore, a conductive layer may be any metal or semi-conductor and may be deposited using sputtering, Chemical Vapor Deposition (CVD), Plasma-Enhance Chemical Vapor Deposition (PECVD), Molecular Vapor Deposition (MVD), or any other thin film deposition method with sufficient conformality.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS device comprising:
    a MEMS substrate comprising a portion of a handle wafer bonded to a patterned electrically conductive device layer within a second wafer with an insulating layer positioned between the handle wafer and the second wafer;
    a CMOS substrate having a front surface, a back surface and one or more metallization layers; the front surface being bonded to the MEMS substrate;
    one or more conductive features on the back surface of the CMOS substrate; and
    electrical connections between the one or more metallization layers and the one or more conductive features.

2. The MEMS device of claim 1, wherein the conductive features are solder balls.

3. The MEMS device of claim 1, wherein the conductive features include a second conductive redistribution layer.

4. The MEMS device of claim 3, wherein a stress relief layer is formed beneath the second conductive redistribution layer.

5. The MEMS device of claim 3, wherein the conductive features are solder balls.

6. The MEMS device of claim 1, wherein the electrical connections comprise
    one or more openings in the back-surface of the CMOS substrate exposing the one or more metallization layers;
    a second insulating layer coating the sidewalls of the one or more openings in the back surface of the CMOS substrate; and
    a conductive layer coating the insulating layer on the back surface of the CMOS substrate and on sidewalls of the one or more openings and providing physical and electrical contact to the one of more metallization layers.

7. The MEMS device of claim 1 further comprising
    an opening penetrating completely through the handle wafer and the insulating layer, and exposing a device layer; and
    a second conductive layer deposited onto the MEMS substrate such that the second conductive layer at least partially covers the surface of the MEMS substrate and the sidewalls of the opening include making physical contact to the device layer, wherein the conductive layer is electrically connected to the device layer.

8. A MEMS device comprising:
- a MEMS substrate, wherein the MEMS substrate includes a portion of a handle wafer bonded to a patterned electrically conductive device layer within a second wafer with an insulating layer positioned between the handle wafer and the second wafer;
- an opening penetrating completely through the portion of the handle wafer and the insulating layer, and exposing the device layer; and
- a conductive layer deposited onto the handle wafer such that the conductive layer at least partially covers the surface of the handle wafer and the sidewalls of the opening including making physical contact to the device layer thereby electrically connecting the conductive layer to the device layer.

9. The MEMS device of claim 8, wherein the opening has sloped sidewalls.

10. The MEMS device of claim 9, wherein a CMOS substrate is bonded to the MEMS substrate.

11. The MEMS device of claim 10, wherein one or more openings in the back-side of the CMOS substrate exposing one or more metal interconnection layer.

12. The MEMS device wafer of claim 11, wherein a second insulating layer coats the sloped sidewalls of the one or more openings in the back-side of the CMOS substrate.

13. The MEMS device wafer of claim 12, wherein a second conductive layer coats the insulating layer on the back-side of the CMOS substrate and on sidewalls of the one or more openings and provides physical and electrical contact to the one of more metal interconnection layers.

14. The MEMS device wafer of claim 13, wherein one or more solder-balls are connected to the second conductive layer.

15. A MEMS device comprising:
- a MEMS substrate, wherein the MEMS substrate includes a top layer connected to an electrically conductive bottom layer;
- an opening penetrating completely through the top layer, and exposing the bottom layer;
- a second electrically conductive layer deposited onto the MEMS substrate such that the second electrically conductive layer at least partially covers the surface and the sidewalls of the opening including making physical contact to the bottom layer, wherein the second electrically conductive layer is electrically connected to the bottom layer; and
- a CMOS substrate is bonded to the MEMS substrate; and
- wherein one or more openings in the back-side of the CMOS substrate exposing one or more metal interconnection layer.

16. The MEMS device of claim 15, wherein the opening through the top layer has sloped sidewalls.

17. The MEMS device of claim 15 wherein a third electrically conductive layer coats the insulating layer on the back-side of the CMOS substrate and on sidewalls of the one or more openings and provides physical and electrical contact to the one of more metal interconnection layers.

18. The MEMS device wafer of claim 17, wherein one or more solder-balls are connected to the third conductive layer.

* * * * *